United States Patent [19]

Hummel et al.

[11] Patent Number: 5,397,429
[45] Date of Patent: Mar. 14, 1995

[54] METHOD OF MANUFACTURING PHOTOLUMINESCING POROUS SILICON USING SPARK EROSION

[75] Inventors: Rolf E. Hummel; Sung-Sik Chang, both of Gainesville, Fla.

[73] Assignee: University of Florida, Gainesville, Fla.

[21] Appl. No.: 121,996

[22] Filed: Sep. 14, 1993

[51] Int. Cl.[6] .................................................. B44C 1/22
[52] U.S. Cl. .................................... 156/643; 148/33.4
[58] Field of Search ................................ 148/33, 33.4; 204/129.3; 257/3; 156/643, 646, 662

[56] References Cited

U.S. PATENT DOCUMENTS

| | | | |
|---|---|---|---|
| 5,256,339 | 10/1993 | Thornton | 264/10 |
| 5,272,355 | 12/1993 | Namavar | 257/3 |
| 5,279,737 | 1/1994 | Sekhar | 210/490 |
| 5,301,204 | 4/1994 | Cho | 372/69 |
| 5,318,676 | 6/1994 | Sailor | 204/129.3 |

*Primary Examiner*—R. Bruce Breneman
*Assistant Examiner*—Joni Y. Chang
*Attorney, Agent, or Firm*—Thomas C. Saitta

[57] ABSTRACT

A high frequency, high voltage spark generator is used to create a large number of sparks to erode the surface of a silicon wafer to a depth of up to 100 microns. After a sufficient amount of erosion has occurred, but prior to any macro-scale removal of material, the surface layer of the silicon wafer becomes porous and photoluminescing. The method can be performed in ambient atmosphere and temperature, or in specific gas atmospheres and at different temperatures. The method produces photoluminescing porous silicon layers on p-type, n-type, low-doped, high-doped or undoped silicon wafers.

10 Claims, No Drawings

METHOD OF MANUFACTURING PHOTOLUMINESCING POROUS SILICON USING SPARK EROSION

BACKGROUND OF THE INVENTION

The invention relates generally to the field of techniques for manufacturing porous silicon. More particularly, the invention relates to the manufacture of photoluminescing porous silicon using spark erosion.

Silicon is widely used in the manufacture of microelectronic devices, but conventionally manufactured silicon is not suitable for light emitting diodes or lasers since it does not photoluminesce. It has recently been discovered that essentially porous silicon is photoluminescing and can therefore be used for light emitting devices. Porous silicon is generally characterized as an array of free-standing, crystalline silicon columns ranging from 2 to 100 nanometers in diameter with a large surface to volume ratio. Pore size and pore density varies.

It is known to create porous silicon by anodic etching of a silicon wafer in aqueous acid solutions, such as a solution containing hydrofluoric acid. Thin layers of porous silicon 3 to 7 microns in depth are produced this way near the surface of the silicon wafer. Examples of such techniques are given in Kinney et al. U.S. Pat. No. 4,532,700, and Katoh et al. U.S. Pat. No. 5,156,896.

Manufacture of porous silicon using anodic etching in hydrofluoric acid-containing aqueous solutions creates problems for research and for large scale manufacture in that the process introduces various contaminants into the silicon, as well as creating an environmental problem since the aqueous solutions used for this purpose are hazardous materials to work with and to dispose of.

It is known to use spark erosion in kerosene to shape or cut delicate materials. A high voltage spark generator creates in this case a large number of sparks which are directed over a particular area of the material. The sparks completely remove some material to create macro-scale holes, grooves, etc.

It is an object of this invention to provide a method for the manufacture of porous silicon layers on silicon wafers using a dry technique which does not involve either anodic etching or the use of acidic aqueous solutions.

It is a further object to provide such a method whereby the porous silicon layer is created by the technique of spark erosion.

It is a further object to provide a photoluminescing porous silicon layer on a silicon wafer by the method of spark erosion.

SUMMARY OF THE INVENTION

The invention comprises a process for the manufacture of photoluminescing porous silicon by spark erosion, and the product made by this process. The process does not require the use of either anodic etching or submersion in aqueous solutions of hydrofluoric acid. In general, a high frequency, high voltage spark generator is used to create a large number of sparks to erode the surface of a silicon wafer. After a sufficient amount of erosion has occurred, but prior to any macro-scale removal of material, the surface layer of the silicon wafer becomes porous and photoluminescing. The method can be performed in ambient atmosphere and temperature, or in specific gas atmospheres and at different temperatures. The method produces photoluminescing porous silicon layers on p-type, n-type, low-doped, high-doped or undoped silicon wafers.

DETAILED DESCRIPTION OF THE INVENTION

Photoluminescing porous silicon layers are produced on silicon wafers by repetitive spark erosion from a spark generator device. The method is applicable in ambient atmosphere at room temperature, or in specific gas atmospheres or at different temperatures. A photoluminescing porous silicon layer with depth less than 100 microns can be produced by this method on p-type, n-type, low-doped, high-doped or undoped silicon wafers.

Any known high frequency, high voltage spark generator device is suitable to provide the sparks necessary to erode the surface of the stock silicon wafer. For example, a high frequency, high voltage, low current Tesla coil capable of producing at least approximately 1000 volts at frequencies of at least one kilohertz can be utilized. Preferably, voltages of at least 10,000 volts and frequencies of at least 10 kilohertz are preferred. The greater the voltage and the frequency, the more rapidly the porous silicon layer is formed.

The spark can be generated between the grounded silicon wafer and any standard electrode tip, such as for instance a tungsten tip, or the spark can be generated between two silicon wafers. In the later instance, possible impurities from the metal tip are eliminated.

The surface to volume ratio and the depth of the porous silicon layer, as well as the intensity of the photoluminescence, and the wavelength of the peak maximum are functions of the treatment time, voltage and frequency. The depth of the porous layer eroded at the same voltage and frequency varies with time of treatment, ranging for example from as little as 2 microns for 2 hour treatment up to 70 microns for 24 hour treatment. Silicon particles produced by the spark erosion may range from 3 to 125 nanometers in diameter and pore size can range from 10 to 2000 nanometers.

Photoluminescence intensity tests utilizing an argon laser having an emission wavelength of 514.5 nanometers, a power of 1.5 mW and a focused beam size of 50 microns in diameter show that photoluminescence intensity peaks increase with increased treatment time, as well as shifting slightly towards the blue range (from about 650 nm to 637 nm). High resolution TEM micrographs reveal randomly oriented, nanometer-scale silicon crystallites embedded in an amorphous silicon dioxide matrix.

It is understood that those skilled in the art may be aware of obvious substitutions or equivalents to the methodology set forth above. The true scope and definition of the invention therefore is to be as set forth in the following claims.

We claim:

1. A method for the manufacture of a photoluminescing porous silicon layer on a silicon wafer substrate comprising the steps of:
   (A) providing a high voltage, high frequency spark generator capable of delivering a high number of sparks to the surface of a silicon wafer substrate;
   (B) eroding a portion of the surface of a silicon wafer substrate to a depth of less than 100 microns by the application of a high number of sparks to said silicon wafer surface to create a porous surface layer.

2. The method of claim 1, where said spark generator produces at least approximately 1000 volts.

3. The method of claim 1, where said spark generator produces at least 10,000 volts.

4. The method of claim 1, where said spark generator operates at frequencies of at least one kilohertz.

5. The method of claim 1, where said eroding is performed at room temperature.

6. The method of claim 1, where said eroding is performed in ambient atmosphere.

7. The method of claim 1, where said eroding is performed in a specific gas atmosphere.

8. The method of claim 1, where said porous surface layer comprises particles ranging from 3 to 125 nanometers in diameter and pores ranging from 10 to 2000 nanometers.

9. The method of claim 1, where said spark generator comprises a metal electrode.

10. The method of claim 1, where said spark generator comprises a silicon electrode.

* * * * *